(12) United States Patent
Mateman et al.

(10) Patent No.: US 6,580,323 B2
(45) Date of Patent: Jun. 17, 2003

(54) INTERFACE CIRCUIT FOR A DIFFERENTIAL SIGNAL

(75) Inventors: Paul Mateman, Nijmegen (NL); Sjoerd Martijn Herder, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/078,974

(22) Filed: Feb. 19, 2002

(65) Prior Publication Data

US 2002/0121931 A1 Sep. 5, 2002

(30) Foreign Application Priority Data

Feb. 21, 2001 (EP) .............................. 01200619

(51) Int. Cl.[7] .................................................. H03F 3/45
(52) U.S. Cl. ........................ 330/252; 330/253; 330/261; 330/300
(58) Field of Search ................................ 330/252, 253, 330/261, 300, 295

(56) References Cited

U.S. PATENT DOCUMENTS

| | | | |
|---|---|---|---|
| 5,515,003 A | | 5/1996 | Kimura ........................ 330/253 |
| 5,525,930 A | * | 6/1996 | Pothast et al. .............. 330/252 |
| 5,552,742 A | * | 9/1996 | Perkins ........................ 327/563 |
| 6,188,280 B1 | * | 2/2001 | Filip ............................ 330/252 |

* cited by examiner

Primary Examiner—Henry Choe
(74) Attorney, Agent, or Firm—Aaron Waxler

(57) ABSTRACT

A circuit comprises a first (6) and a second (21) input for receiving a differential signal and a buffer circuit. The buffer circuit comprises an input stage with a first (2, 2a, 2b, 13, 13a, 13b) and a second (8, 18) differential amplifier, a current source for supplying a first current of a first polarity to the first differential amplifier (2, 2a, 2b, 13, 13a, 13b), and a second current source for supplying a second current of opposite polarity to the second differential amplifier (8, 18). Each of the differential amplifiers (2, 13; 8, 18) has a first input (5,7) coupled to the first input (6) of the circuit and a second input (14, 19) coupled to the second input (21) of the circuit. Said circuit further comprises a combination stage comprising at least one chain with a first node (58) coupled to an output (58) of the first differential amplifier (2, 2a, 2b, 13, 13a, 13b) and a second node (84) coupled to an output (84) of the second differential amplifier (8, 18), and an active circuit, a main current path of which is coupled between the first (58) and the second (84) node. The control electrode of the active circuit is coupled to a bias voltage. The active circuit comprises a single transistor. The bias voltage is a fixed voltage. At least one of the two outputs (58,84) to which a node is coupled, is an output of the buffer circuit. A hysteresis adding circuit (75) is coupled to the at least one output of the buffer circuit.

23 Claims, 3 Drawing Sheets

INTERFACE CIRCUIT FOR A DIFFERENTIAL SIGNAL

BACKGROUND OF THE INVENTION

1. Field of the Invention

The invention relates to a circuit comprising a first and a second input for receiving a differential signal and a buffer circuit, which buffer circuit comprises an input stage with a first and a second differential amplifier, a first current source for supplying a first current of a first polarity to the first differential amplifier, a second current source for supplying a second current of opposite polarity to the second differential amplifier, in which each of the differential amplifiers has a first input coupled to the first input of the circuit and a second input coupled to the second input of the circuit, a combination stage comprising at least one chain with a first node coupled to an output of the first differential amplifier and a second node coupled to an output of the second differential amplifier, and an active circuit, a main current path of which is coupled between the first and the second node, a control electrode of said active circuit being coupled to a bias voltage.

2. Description of the Related Art

Such a circuit is known from U.S. Pat. No. 5,703,532. Said patent discloses a differential signal amplifier having a rail-to-rail common-mode input voltage range. It is not known whether the gain for small signals of the entire circuit is constant over the entire common-mode range. Furthermore, said circuit is built up entirely of field effect transistors, which imposes limits as regards the highest frequencies that can be handled. SUMMARY OF THE INVENTION It is an object of the invention to provide a circuit, which exhibits a substantially constant gm signal gain for small signals over the entire common-mode range and which is capable of handling high frequencies.

In addition, it is an object of the invention to provide a circuit for a differential signal amplifier, which is capable of handling the current standards (P)ECL, CML and LVSD. One common feature of these standard interfaces for high speeds is, among other things, the fact that they are differential, that a transmission line interface is provided, that is, generally 50 Ohm turn-off (or 100 Ohm differential), that the voltage swing is limited (200 mV . . . 800 mV diff) and that there is a defined hysteresis on the input. The differences mainly reside in the common-mode signals levels: CML level is substancially equal to a level of the positive rail, LVDS level is substancially equal to a level of the negative rail and (P)ECL level is lower than a level of the positive rail e.g. circa 1.3 V. LVDS is the most recent of said standards. LVDS is a data interface standard which is defined in the TIA/EIA-644 and the IEEE 1596.3 standards. The LVDS standard is used for high-speed transmission of binary data over copper conductors. The voltage swing is smaller than that of other transmission standards. Because of this small voltage difference, the data transmission speed is higher and an inherently larger bandwidth is obtained with a lower power consumption. In addition, LVDS produces less electromagnetic interference than other transmission standards.

Another object of the invention is to provide an interface circuit that can suitably function as an input stage in systems in which signals are transmitted in the form of differential signals that comply with the LVDS standard.

In order to accomplish that objective, a circuit according to the invention is wherein the active circuit comprises a single transistor, the bias voltage is a fixed voltage, and at least one of the two outputs to which a node is coupled, is an output of the buffer circuit.

As a result, the input signals can be differential signals, with the common-mode being capable of moving from rail-to-rail and a high degree of constancy of the gain over the entire common-mode range being obtained.

A preferred embodiment of a circuit according to the invention is wherein a hysteresis adding circuit is coupled to an output of the buffer circuit.

The hysteresis adding circuit enables precise determination of the degree of hysteresis that the circuit can accept. This is in particular important in the case of the LVDS standard, in which 25-millivolt hysteresis on the input of the circuit must be possible.

BRIEF DESCRIPTION OF THE DRAWINGS

The invention will now be explained in more detail with reference to the accompanying drawings, in which.

DETAILED DESCRIPTION OF THE PREFERRED EMBODIMENTS

Figure 1:
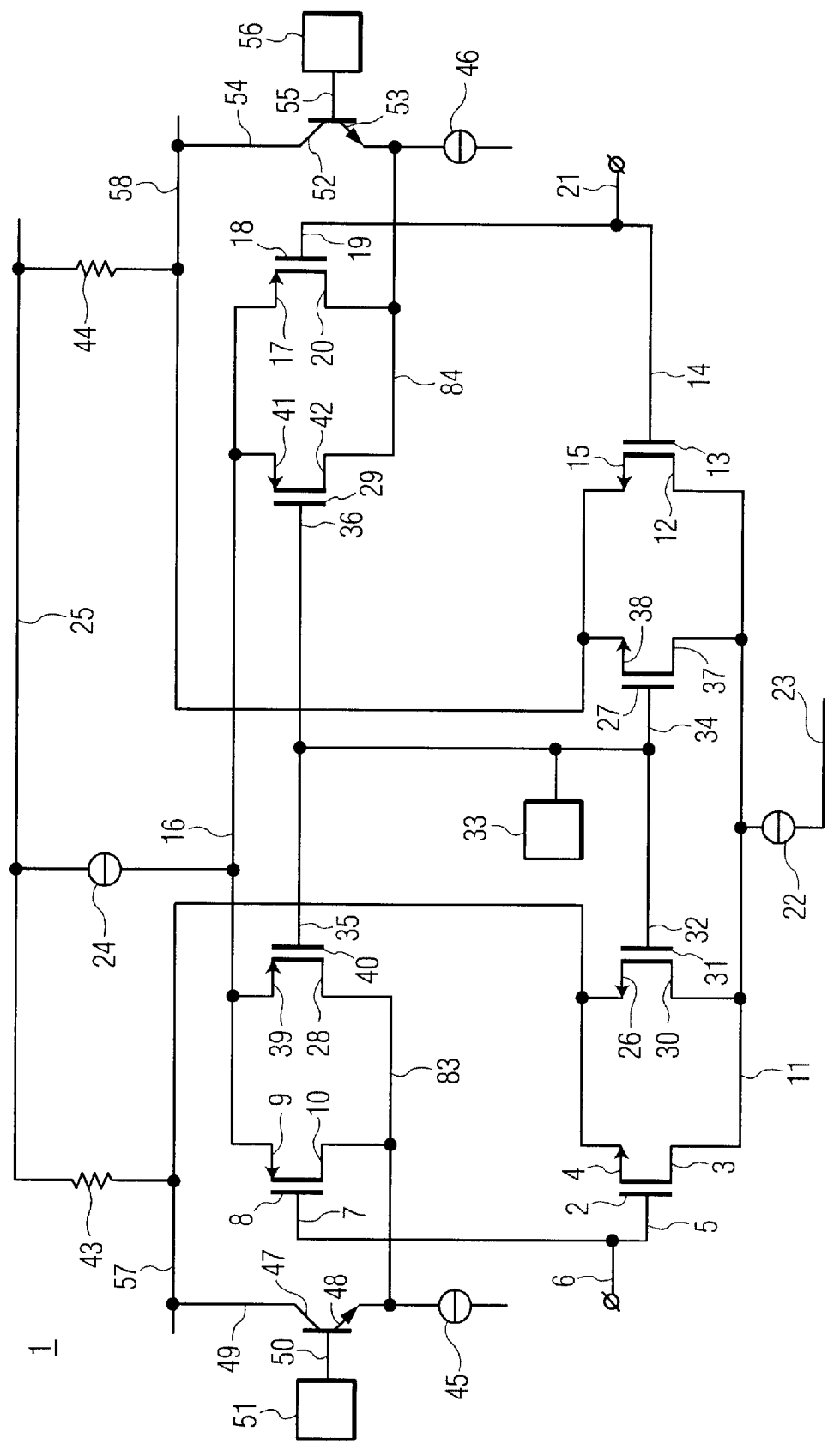
FIG. 1 is a representation of a buffer circuit.

FIG. 1 shows a buffer circuit for an interface circuit for a differential signal amplifier. The buffer circuit 1, comprises a first NMOSFET 2 with a source 3, a drain 4 and a control electrode 5 as the main electrodes. The control electrode 5 is coupled to a first input 6 of two differential inputs 6 and 21. The input 6 is also coupled to a control electrode 7 of a third PMOSFET 8. MOSFET 8 furthermore comprises a source 9 and a drain 10 as main electrodes. Source 3 of MOSFET 2 is coupled via a node 11, to a source 12 of a MOSFET 13, which is further provided with a control electrode 14 and a drain 15. The source 9 of the third PMOSFET 8 is coupled to a source 17 of a fourth PMOSFET via a second node 16. PMOSFET also includes a control electrode 19 and a drain 20. The control electrodes 19 and 14 are coupled to a second differential input 21 of the buffer circuit 1. The first node 11 is coupled to a second feeder 23 via a constant current source 22. The second node 16 is coupled to a first feeder 25 via a second current source 24. MOSFETS 26, 27, 28 and 29 are coupled in parallel to MOSFETS 2, 13, 8 and 18, respectively. First parallel NMOSFET 26 is coupled to first node 11 with a source 30, to drain 4 of NMOSFET 2 with drain 31 and to a voltage source 33 with a control electrode 32. Voltage source 33 is also coupled to control electrode 34 of NMOSFET 27, to control electrode 35 of PMOSFET 28 and to control electrode 36 of PMOSFET 29. A source 37 of NMOSFET 27 is coupled to first node 11, and a drain 38 of MOSFET 27 is coupled to drain 15 of NMOSFET 13. A source 39 of PMOSFET 28 is coupled to second node 16. Drain 40 of PMOSFET 28 is coupled to drain 10 of PMOSFET 8. Source 41 of PMOSFET 29 is coupled to second node 16, and drain 42 of PMOSFET 29 is coupled to drain 20 of PMOSFET 18. The node of drains 4 and 31 is coupled to feeder 25 via a resistor 43. The node of drains 38 and 15 is likewise coupled to first feeder 25, via a resistor 44. The drains 10 and 40 of MOSFETs 8 and 28 are coupled to second feeder 23 via a load in the form of a current source 45. Likewise, the drains 20 and 42 of MOSFETs 18 and 29 are coupled to second feeder 23 via a load in the form of a current source 46. Coupled between loads 43 and 45 is an NPN transistor 47, the emitter 48 of which is coupled to the load 45 and the collector 49 of which is coupled to load 43. The base of transistor 47 is coupled to a fixed voltage source 51. Likewise, an NPN transistor 52 is coupled between loads 44 and 46, an emitter 53 of which is coupled to load 46 and a collector 54 of which is coupled to load 44. A base 55 of transistor 52 is coupled to a fixed voltage source 56.

MOSFETs 8 and 18 form a differential PMOS pair and MOSFETs 2 and 13 form a differential NMOS pair. The width-length relations, more generally referred to as the W/L relations, of said four MOSFETs are scaled in such a manner that the gm's are identical as much as possible. Fixed voltage source 33 delivers a voltage that is referred to as Vbias. The MOSFETs 28 and 29 form a bypass when the input level on the inputs 6 and 21 is (much) higher than Vbias, and the MOSFETs 26 and 27 form a bypass when the input level on the inputs 6 and 7 is lower than Vbias. All PMOSFETs 8, 18, 28 and 29 are identical. The NMOSFETs 26 and 27, however, have a slightly smaller length L than the NMOSFETs 2 and 13. The consequence is that the gain gm for small signals of the entire buffer circuit is substantially constant over the entire common-mode range.

Vbias is a setting voltage. In the case of high common-mode voltages, only MOSFETs 2 and 13 contribute to the gain; in the case of the low common-mode voltages, on the other hand, only PMOSFETs 8 and 18 do so. If the common-mode voltage equals Vbias, both differential pairs contribute. In that case, the gain would be higher than in the case in which only pair contributes. The MOSFETs 26, 27, 28 and 29 each use up a little current (gain, therefore) so that the total gain remains constant all the same. Small adjustments of the W/L relation of the MOSFETs 26 and 27 ensure that the total gain will remain substantially constant over the entire common-mode range. According to another possibility of ensuring the constancy of the total gain, it is not the W/L relation of the MOSFETs 26 and 27 that is adjusted, but the Vbias that is supplied to the control electrodes 35 and 36. The fixed voltage source 33 is capable of delivering at least to fixed voltages in that case, the first fixed voltage being supplied to the node of the control electrodes 32 and 34, and the second fixed voltage being supplied to the node of the control electrodes 35 and 36. Buffer circuit 1 is very fast and has a rail-to-rail common-mode range. However, the buffer circuit exhibits hardly any hysteresis, if at all. As already described in the foregoing, at least the LVDS standard requires the presence of hysteresis. In order to introduce hysteresis in the interface circuit, a hysteresis adding circuit 75 (See FIG. 2) is used. The node of the drains 4 and 26, load 43 and collector 49 is indicated by numeral 57 in FIGS. 1 and 2. Likewise, the node of drains 15 and 38, the load 44 and collector 54 is indicated by numeral 58. Further coupled to node 57 is a load 59 (see FIG. 2), which load is further coupled to a collector 60 of an NPN transistor 61 and to a control electrode 62 of an NPN transistor 63. Likewise, node 58 is coupled to a load 64, which in turn is coupled to a collector 65 of transistor 63 and to a control electrode 66 of transistor 61. The emitters 67 and 68 of transistors 61 and 63 are intercoupled in a node 69, which node 69 is coupled to a second feeder 23 via a current source 70. The cross-coupled pair of NPN transistors 61, 63 effects a certain degree of hysteresis, which can be set by a specific selection of the transistors and a matching selection of the loads 59 and 64. In this way, a hysteresis requirement in a standard as referred to above can readily be met.

Figure 3:
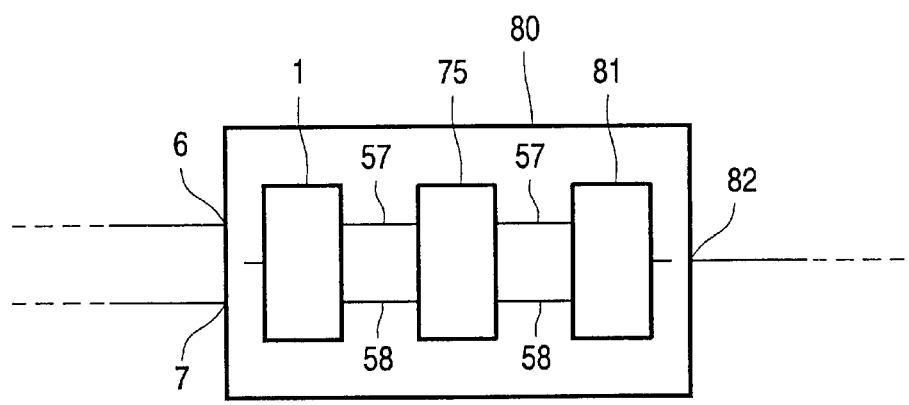
FIG. 3 is a schematic representation of an interface circuit.

In FIG. 3, the entire interface circuit is schematically represented. The interface circuit 80 comprises a buffer circuit 1 having two inputs 6 and 7, a hysteresis adding circuit 75 having inputs and outputs 57 and 58 and a differential stage 81, which is known per se, with the desired signal, which is either high or low in the case of digital use of the circuit, being output on output 82.

It is noted that it is possible to leave out the hysteresis adding circuit 75 in applications where hysteresis is not required.

In FIG. 1, loads 45 and 46 are represented as current sources. It is noted that it is also possible to use resistors instead of current sources. It is furthermore noted that it is possible to use mirror-symmetrical versions both of the circuit of FIG. 1 and of the circuit of FIG. 2, in which case all N-elements are substituted for P-elements, and conversely.

The terms N-elements and P-elements are understood to mean N-MOS field effect transistors as well as NPN bipolar transistors and P-MOS field effect transistors as well as PNP bipolar transistors, respectively. The input elements 2, 8, 13 and 18 must comprise MOS field effect transistors, for the other elements a free choice can be made between MOS and bipolar.

Figure 2:
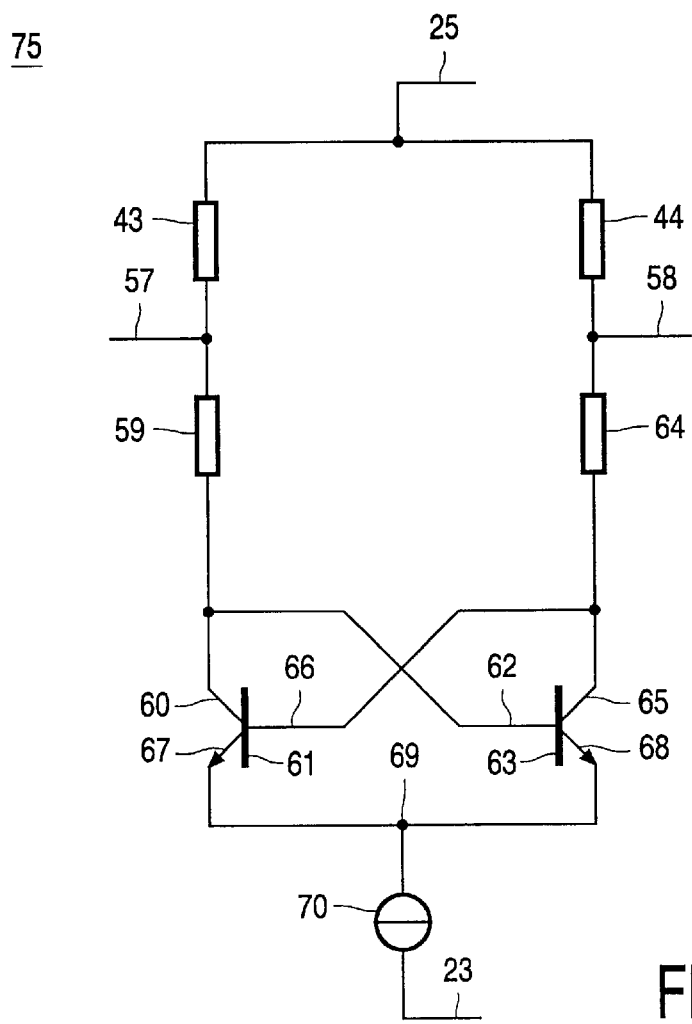
FIG. 2 is a representation of a hysteresis adding circuit.
Figure 4:
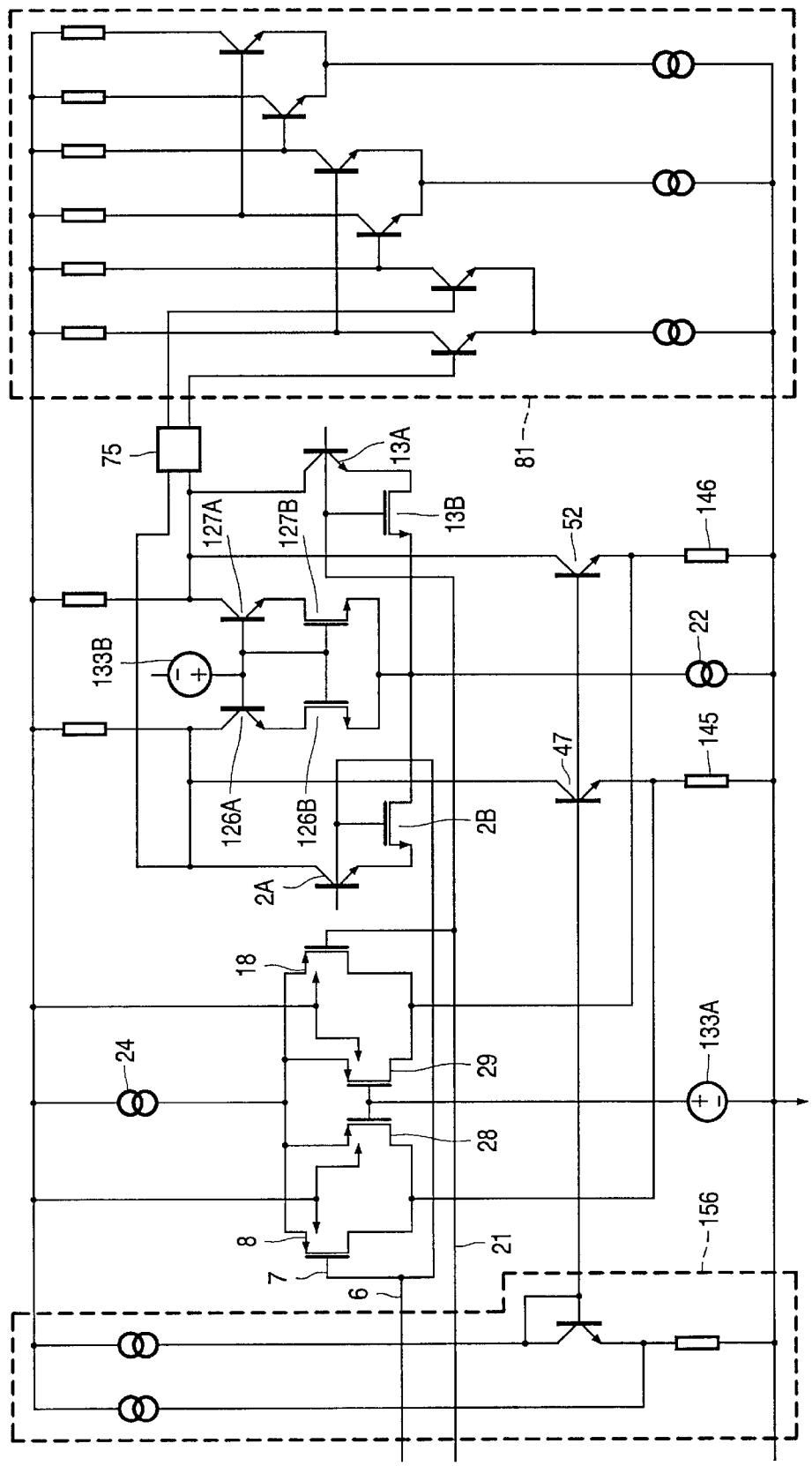
FIG. 4 is a second embodiment of a circuit according to the invention.

FIG. 4 shows a second embodiment of a circuit according to the invention. In FIG. 4, those elements that are identical to elements shown in FIGS. 1, 2 and 3 are represented by the same numerals. In the circuit according to FIG. 4, the input transistors 2 and 13 have been substituted for a combination of an NPN transistor 2a and 13a, respectively, and a field effect transistor 2b and 13b, respectively. As a result, the frequency range of the circuit has been enlarged. A similar modification has been carried out with the transistors 26 and 27 of FIG. 1, which have been substituted for the combinations of NPN transistor and field effect transistor 126a, 126b and 127a, 127b, respectively. As already indicated in the foregoing, not all four control electrodes 32, 34, 35 and 36 of FIG. 1 need to be coupled to the same fixed voltage as supplied by the voltage source 33. In FIG. 4, the control electrodes of the transistors 28 and 29 are coupled to a fixed voltage source 133a, for example, whilst the control electrodes of the transistors 126a, 126b, 127a and 127b are coupled to a fixed voltage source 133b. It is likewise indicated in the foregoing that the current sources 45 and 46 of FIG. 1 can be substituted for resistors. This is the case in the circuit according to FIG. 4, in which resistors 145 and 146, respectively, are used instead of said current sources. In the circuit according to FIG. 1, the control electrodes 50 and 55 of the transistors 47 and 52 are coupled to, respectively, a fixed voltage source 51 and a fixed voltage source 56. In the circuit according to FIG. 4, the control electrodes of the transistors 47 and 52 are coupled both to each other and to a single fixed voltage source 156. FIG. 4 furthermore shows the hysteresis adding circuit 75, as well as an elaboration of the differential stage 81, which is known per se to those skilled in the art and which will not be discussed in more detail, therefore.

All kinds of embodiments and modifications will be obvious to a person skilled in the art who has perused the above. All such embodiments and modifications are considered to fall within the scope of the invention.

What is claimed is:

1. A circuit (1) comprising a first (6) and second (21) input terminals for receiving a differential signal and a buffer circuit, which buffer circuit comprises an input stage with a first (2, 13) and second (8,18) differential amplifiers, a first current source (22) for supplying a first current of a first polarity to the first differential amplifier (2,13), a second current source (24) for supplying a second current of opposite polarity to the second differential amplifier (8,18), in which each of the differential amplifiers (2,13; 8, 18) has a first input (5,7) coupled to the first input terminal (6) of the circuit and a second input (14,19) coupled to the second input terminal (21) of the circuit, a combination stage including a single transistor (47, 52) the combination stage comprising at least one chain with a first node (57,58) coupled to an output (4,15) of the first differential amplifier (2,13) and a second node (83,84) coupled to an output (9,41) of the second differential amplifier (8,18) and the combination stage (47,52), includes a respective main current path of the combination stage (47 or 52) being coupled between one of the first (57,58) and the second (83,84) respective nodes, a control electrode (50,55) of said combination stage (47,52) being coupled to a bias voltage (51,56), wherein the combination stage comprises a single transistor (47,52), the bias voltage (51,56) is a fixed voltage, and at least one of the two outputs (57,58,83,84) to which a node is coupled, is one output (57,58, 83, 84) of the buffer circuit.

2. A circuit (1) as claimed in claim 1, wherein said single transistor is a bipolar transistor (47, 52).

3. A circuit (1) as claimed in claim 1, wherein an output electrode (49,54) of said single transistor (47,52) is coupled to one (57,58) of the two nodes and that the output (57,58) of the differential amplifier (2,13) to which said one of the two nodes is coupled, is coupled to a fixed voltage via a resistor (43,44).

4. A circuit (1) as claimed in claim 1, wherein said at least one chain comprises a first (47) and a second (52) chain, the first node (57) of the first chain (47) is coupled to a first output (4) of the first differential amplifier (2), and the second node (83) of the first chain (47) is coupled to a first output (10) of the second differential amplifier (8), that the first node (58) of the second chain (52) is coupled to a second output (15) of the first differential amplifier (13), and the second node (84) of the second chain (52) is coupled to a second output (20) of the second differential amplifier (18), one (57) of the two first outputs (4,15) of the first (2,13) and the second (8,18) differential amplifiers is a first output (57) of the buffer control circuit, and one (58) of the two second outputs (15,20) of the first (2, 13) and the second (8,18) differential amplifier is a second output (58) of the buffer circuit.

5. A circuit (1) as claimed in claim 1, wherein a hysteresis adding circuit (75) is coupled to the at least one output (57, 58; 83, 84) of the buffer circuit.

6. A circuit (1) as claimed in claim 5, wherein the hysteresis adding circuit (75) comprises a cross-coupled pair of active circuits (61, 63).

7. A circuit (1) as claimed in claim 6, wherein an input electrode (67, 68) of each active circuit (61, 63) of the cross-coupled pair of active circuits is coupled to a fixed voltage (23) via a common current-carrying element (70), an output electrode (60, 65) of at least one active circuit (61, 63) of the cross-coupled pair of active circuits is coupled to said at least one output (57, 58; 83, 84) of the buffer circuit.

8. A circuit (1) claimed in claim 4, wherein the output electrode (60, 65) of each active circuit (61, 63) of the cross-coupled pair of active circuits is coupled to, respectively, the first (57, 83) and the second (58, 84) output of the buffer circuit.

9. A circuit (1) as claimed in claim 1, wherein the first (5, 7) and the second (14, 19) input of each differential amplifier (2, 13; 8, 18) are coupled to, respectively, a first (2; 2a, 2b) and a second (13; 13a; 13b, 18) active circuit with a main current path between an associated third (11, 16) and fourth (57, 58, 83, 84) node, an additional first (26, 126a, 126b, 27, 127a, 127b) and second (28, 29) differential amplifier are provided, in which each additional differential amplifier (26, 126a, 126b, 27, 127a, 127b, 28, 29) comprises a first (26, 126a, 126b, 28) and a second (27, 127a, 127b, 29) active circuit with a main current path, the main current path of the first (26, 126a, 126b, 28) and second (27, 127a, 127b, 29) active circuit of the additional first (26, 126a, 126b, 27, 127a, 127b) and second (28, 29) differential amplifier is coupled in parallel to the main current path of the corresponding first (2, 2a, 2b, 3) and second (8, 18), respectively, active circuit of the first (2, 2a, 2b, 3) and the second (8, 18) differential amplifier between respective associated third (11, 16) and fourth (57, 58, 83, 84) nodes, the active circuits (26, 126a, 126b, 27, 127a, 127b, 28, 29) of the additional first (26, 126a, 126b, 27, 127a, 127b) and second (28, 29) differential amplifier are provided with an input (32, 34, 35, 36), which inputs (32, 34, 35, 36) are coupled to an associated fixed voltage (33, 133a, 133b).

10. A circuit (1) as claimed in claim 9, wherein the associated fixed voltage (133a) is identical for the control electrodes of the additional first difference amplifier.

11. A circuit (1) as claimed in claim 9, wherein the associated fixed voltage (113a) is identical for the control electrodes of the additional second differential amplifier.

12. A circuit (1) as claimed in claim 9, wherein the associated fixed voltage is an identical first associated fixed voltage (133b) for the inputs (32, 34) of the additional first difference amplifier (126, 127) and an identical second associated fixed voltage (133a) for the inputs (35, 36) of the additional second differential amplifier (28, 29).

13. A circuit (1) as claimed in claim 9, wherein the associated fixed voltage (33) is identical for the control electrodes (32, 34, 35, 36) of the additional first (26, 126a, 126b, 27, 127a, 127b) and second (28, 29) differential amplifier.

14. A circuit (1) as claimed in claim 1, wherein the first (5, 7) and the second (14, 19) input of both the first (2, 2a, 2b, 13, 13a, 13b) and the second (8, 18) differential amplifier are coupled to, respectively, a first (2, 8) and a second (13, 18) active circuit with a main current path between an associated third (11, 16) and fourth (57, 58, 83, 84) node, and that the associated first (2, 8, 2a, 2b) and second (13, 18, 13a, 13b) active circuit are identical for each differential amplifier ((2, 2a, 2b, 13, 13a, 13b, 8, 18).

15. A circuit (1) as claimed in claim 14, wherein the first and the second active circuit comprise a field effect transistor (2, 8, 13, 18).

16. A circuit (1) as claimed in claim 15, wherein the active circuits of one of said first and said second differential amplifiers comprise N-type elements (2, 2a, 2b, 13, 13a, 13b).

17. A circuit (1) as claimed in claim 16, wherein the N-type elements comprise a bipolar transistor (2a, 13a) with an N-type field effect transistor (2b, 13b) in the emitter line.

18. A circuit (1) as claimed in claim 9, wherein the first (26, 126a, 126b, 27, 127a, 127b) and the second (28, 29) active circuit are identical for each additional differential amplifier.

19. A circuit (1) as claimed in claim 18, wherein the first and the second active circuit comprise a field effect transistor (26, 126a, 126b, 27, 127a, 127b, 28, 29).

20. A circuit (1) as claimed in claim 19, wherein the active circuits of one of the first and the second differential amplifiers comprise N-type elements (2, 2a, 2b, 13, 13a, 13b).

21. A circuit (1) as claimed in claim 20, wherein the N-type elements comprise a bipolar transistor (2a, 13a) with an N-type field effect transistor (2b, 13b) in the emitter line.

22. A circuit (1) as claimed in claim 11, wherein the W/L relations of the respective field effect transistors of each differential amplifier (2, 13; 2b, 13b; 8, 18) that comprises field effect transistors are substancially equal to each other.

23. A circuit (1) as claimed in claim 1, wherein the buffer circuit is coupled to a differential stage (81).

* * * * *